United States Patent
Norton

(10) Patent No.: US 11,202,149 B1
(45) Date of Patent: Dec. 14, 2021

(54) VEHICLE AUDIO CONTROL

(71) Applicant: Ford Global Technologies, LLC, Dearborn, MI (US)

(72) Inventor: Alan Norton, West Bloomfield, MI (US)

(73) Assignee: FORD GLOBAL TECHNOLOGIES, LLC, Dearborn, MI (US)

( * ) Notice: Subject to any disclaimer, the term of this patent is extended or adjusted under 35 U.S.C. 154(b) by 0 days.

(21) Appl. No.: 17/017,736

(22) Filed: Sep. 11, 2020

(51) Int. Cl.
| | |
|---|---|
| *H04R 3/04* | (2006.01) |
| *H04S 1/00* | (2006.01) |
| *H04S 3/00* | (2006.01) |
| *G10L 25/51* | (2013.01) |
| *H04S 7/00* | (2006.01) |

(52) U.S. Cl.
CPC ............... *H04R 3/04* (2013.01); *G10L 25/51* (2013.01); *H04S 1/007* (2013.01); *H04S 3/008* (2013.01); *H04S 7/30* (2013.01); *H04R 2430/01* (2013.01); *H04R 2499/13* (2013.01); *H04S 2400/01* (2013.01); *H04S 2400/13* (2013.01)

(58) Field of Classification Search
None
See application file for complete search history.

(56) References Cited

U.S. PATENT DOCUMENTS

| | | | |
|---|---|---|---|
| 8,194,887 B2 | 6/2012 | Cheah et al. | |
| 8,891,789 B2 | 11/2014 | McGrath | |
| 9,768,748 B2 | 9/2017 | Seefeldt | |
| 10,333,483 B2 | 6/2019 | You | |
| 2007/0258603 A1* | 11/2007 | Avendano | H03G 5/165 |
| | | | 381/106 |
| 2018/0278224 A1 | 9/2018 | Kosuge et al. | |
| 2019/0371324 A1* | 12/2019 | Powell | G10L 15/22 |

FOREIGN PATENT DOCUMENTS

WO    2007120453 A1    10/2007

\* cited by examiner

*Primary Examiner* — Paul W Huber
(74) *Attorney, Agent, or Firm* — Frank Lollo; Beijin Bieneman PLC

(57) ABSTRACT

A computer, including a processor and a memory, the memory including instructions to be executed by the processor to determine a first root-mean-square signal level of an audio data stream with a first delay, apply a bass shelf filter to the audio data stream based on the first root-mean-square signal level and an audio volume level, determine a second root-mean-square signal level of an audio data stream with a second delay and apply a treble shelf filter to the audio data stream based on the second root-mean-square signal level and the audio volume level. The instructions include further instructions to output the audio data stream to an audio amplifier and one or more speakers.

20 Claims, 5 Drawing Sheets

VEHICLE AUDIO CONTROL

BACKGROUND

Vehicles can be equipped with computing devices, networks, sensors and controllers to acquire data regarding the vehicle's environment and to operate the vehicle based on the data. Vehicle sensors can provide data concerning routes to be traveled and objects to be avoided in the vehicle's environment. Operation of the vehicle can rely upon acquiring accurate and timely data regarding objects in a vehicle's environment while the vehicle is being operated on a roadway.

DETAILED DESCRIPTION

Figure 1:
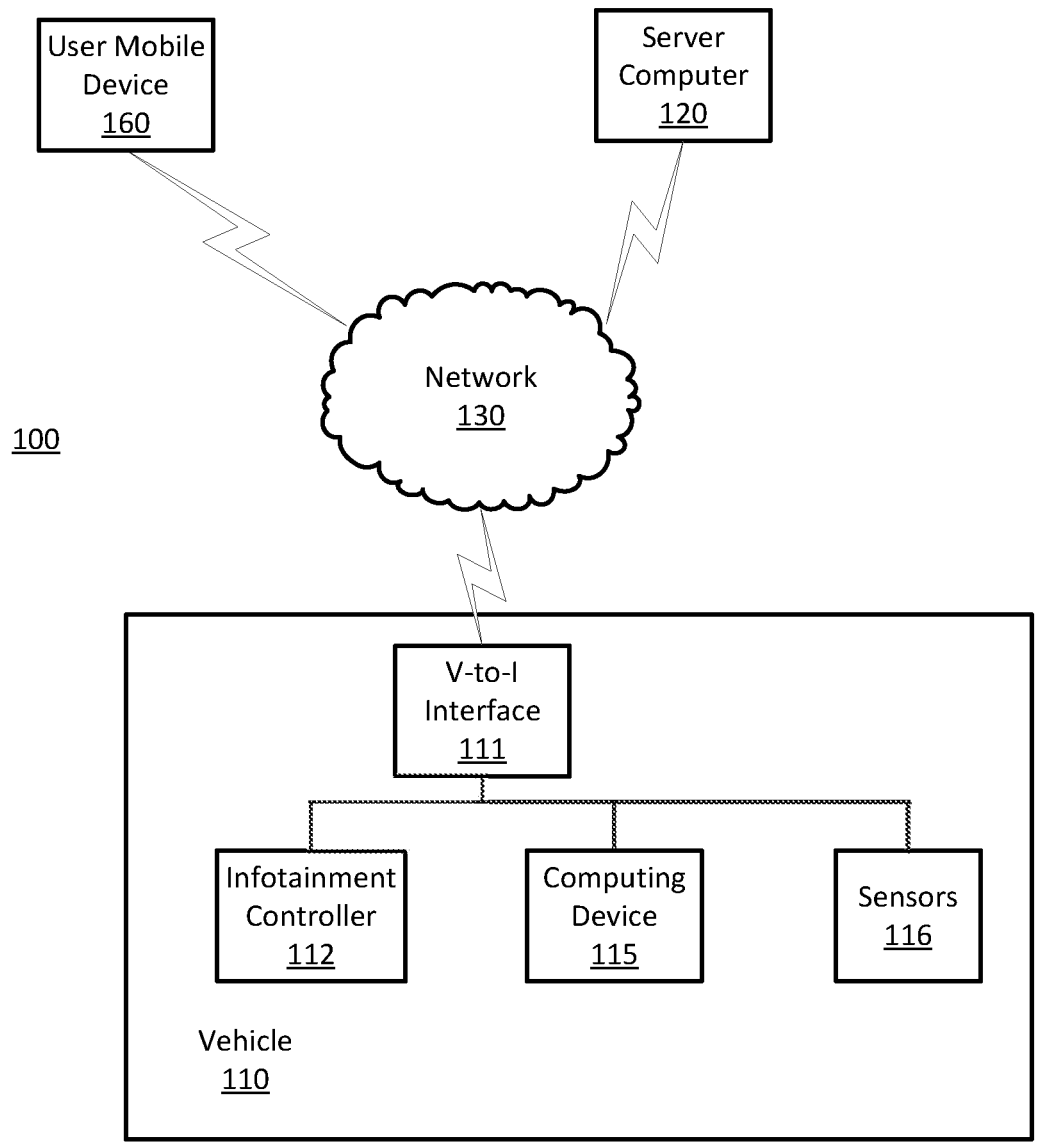
FIG. 1 is a diagram of an example traffic infrastructure system.

A computing device in a vehicle can be programmed to control aspects of vehicle operation including operating an entertainment system. A vehicle entertainment system can include a vehicle audio system which can include an audio program selector, a volume control, an audio data processor, one or more audio amplifiers and one or more speakers. An audio program selector can select audio program material or data from a variety of sources including received radio signals, locally sourced program material including solid state storage devices, and wired or wirelessly connected program sources including smart phones. A volume control adjusts the loudness, measured in decibels (dB), of the audible signal emitted from the vehicle audio system. An audio data processor can include components to adjust the equalization (EQ) of the audio data. EQ refers to relative levels of bass, midrange, or treble frequencies present in the audio data. Bass frequencies refer to low audio frequencies, typically ranging from the lowest frequencies the audio system can reproduce, for example about 20 Hz to about 300 Hz. Midrange frequencies typically range from about 300 Hz to about 4,000 Hz. Treble frequencies typically range from about 4,000 Hz to the highest frequencies produced by the audio system, typically about 20,000 Hz.

The audio data in an audio program can include music recorded at a wide variety of volume levels with differing equalization (EQ), for example. In examples described herein, the audio data processor is implemented as a digital signal processor. Audio data processors can also be implemented by configuring analog circuitry to accomplish the same functions as the digital circuits described herein. The digital circuits described herein process analog audio data by sampling and digitizing the analog audio data stream using an analog-to-digital converter or directly processing a digital audio stream. The perceived overall volume of a vehicle audio system can depend upon the volume level of the vehicle audio system set by the volume control, the volume at which the audio data was recorded, and the volume of the particular portion of the audio data. For example, low volume passages of music can require different EQ adjustments than high volume passages. Users tend to adjust audio signal levels to achieve acceptable mid-range volumes. Because low frequencies (bass) and high frequencies (treble) have different effects upon human hearing, adjusting volume based on mid-range frequencies can require additional adjustments to achieve acceptable listening. Because of the complex interaction of volume and EQ for different audio program sources, this adjustment can be non-obvious and therefore difficult for an occupant of a vehicle. Techniques discussed herein improve audio data EQ by determining a correct EQ to apply to all types of audio data regardless of the program source or volume level within seconds of the start of a new program source.

Human hearing reacts differently to audio EQ depending upon the overall volume level of the audio signal. For example, low frequencies (bass) can require more audio power to be perceived at the same level as high frequencies (treble). High frequencies (treble) can be perceived as "hiss" at very low volume levels and perceived as "harshness" or signal noise at high volume levels. Because the recorded volume levels and EQ on various program sources for audio data can be different, bass and treble controls can be adjusted for each portion of an audio program, for example each song or portion of a song to provide acceptable perceived EQ.

Acceptable perceived EQ is defined as EQ that provides an audio signal that is perceived by a human listener as having a balanced amount of bass and treble in the audio signal. Although a "balanced amount of treble and bass" can be a subjective measure, a balanced amount of treble and bass for present purpose can be predetermined, e.g., by surveying a plurality of users listening to a plurality of audio programs including both music and human voice recordings at a plurality of bass and treble settings and a plurality of volumes. The survey results can be tabulated to determine bass and treble settings that yield results that are perceived as balanced by a majority of listeners for each type of audio data and each volume level. Techniques described herein improve an audio system by determining bass and treble control levels to apply to each portion of an audio program by analyzing the audio data at the selected volume level and applying the determined bass and treble controls to the audio data to automatically produce an audio signal with bass and treble controls adjusted to provide acceptable perceived EQ and therefore pleasing listening to human hearing at any selected volume level. In examples discussed herein, these techniques will be applied to vehicle audio systems, however, similar techniques would apply to home or commercial audio systems also.

Disclosed herein is a method, including determining a first root-mean-square signal level for an audio data stream with a first delay and apply a bass shelf filter to the audio data stream based on the first root-mean-square signal level, determining a second root-mean-square signal level for the audio data stream with a second delay and apply a treble shelf filter to the audio data stream based on the second root-mean-square signal level, and outputting the audio data stream to an audio power amplifier. The audio data stream can be determined by sampling and digitizing an analog audio signal. The first delay can be greater than the second delay. The first root mean square signal level can be determined by summing squared digital values of the audio data stream over a first time period. The bass shelf filter can perform a bass boost filter by inputting a first dB value output by a first lookup table based on inputting the first root mean square signal level to the first lookup table to determine the first dB value to output to the bass shelf filter for first root mean square signal values between zero and a first percentage of a maximum audio volume and wherein the bass shelf filter performs a bass boost filter by inputting a second dB value output by the first lookup table based on inputting the root mean square signal level to the first lookup table to determine a second dB value to output to the bass shelf filter for first root mean square signal values between the first percentage and a maximum audio volume.

The second root mean square signal level can be determined by summing squared digital values of the audio data stream over a second time period. The treble shelf filter can perform a treble cut filter by inputting a third dB value output from a second lookup table based on inputting the second root mean square signal level to the second lookup table that determines the third dB value to output to the treble shelf filter for second root mean square signal values between zero and second percentage of a maximum audio volume, wherein the treble shelf filter performs a treble cut filter by inputting a fourth dB value output from the second lookup table based on inputting the second root mean square signal level to the second lookup table that determines a fourth dB value output to the treble shelf filter for second root mean square signal levels between the second percentage of a maximum audio volume and a third percentage of the maximum audio volume and wherein the treble shelf filter performs a treble cut filter by inputting a fifth dB value output from the second lookup table based on inputting the second root mean square signal level to the second lookup table that determines the fifth dB value output from the second lookup table for second mean square signal levels between the third percentage of the maximum audio volume and the maximum audio volume. An audio volume level can be a value between zero and 100% that is applied to the audio data stream to determine an output signal strength to be applied. The audio data stream can include left and right stereo audio data streams and wherein the bass shelf filter and the treble shelf filter is applied to the left and right stereo audio data streams. The audio data stream can include a plurality of surround sound audio data streams and wherein the bass shelf filter and the treble shelf filter is applied to left and right stereo audio data streams before up mixing to form the plurality of surround sound audio data streams. The audio data stream can be processed by a vehicle audio system. The vehicle audio system can include a program selector to select audio program material. The vehicle audio system can include one or more computing devices and one or more digital signal processors. The vehicle audio system can be included in a vehicle infotainment system.

Further disclosed is a computer readable medium, storing program instructions for executing some or all of the above method steps. Further disclosed is a computer programmed for executing some or all of the above method steps, including determining a first root-mean-square signal level for an audio data stream with a first delay and apply a bass shelf filter to the audio data stream based on the first root-mean-square signal level, determining a second root-mean-square signal level for the audio data stream with a second delay and apply a treble shelf filter to the audio data stream based on the second root-mean-square signal level, and outputting the audio data stream to an audio power amplifier. The audio data stream can be determined by sampling and digitizing an analog audio signal. The first delay can be greater than the second delay. The first root mean square signal level can be determined by summing squared digital values of the audio data stream over a first time period. The bass shelf filter can perform a bass boost filter by inputting a first dB value output by a first lookup table based on inputting the first root mean square signal level to the first lookup table to determine the first dB value to output to the bass shelf filter for first root mean square signal values between zero and a first percentage of a maximum audio volume and wherein the bass shelf filter performs a bass boost filter by inputting a second dB value output by the first lookup table based on inputting the root mean square signal level to the first lookup table to determine a second dB value to output to the bass shelf filter for first root mean square signal values between the first percentage and a maximum audio volume.

The computer can be further programmed to determine the second root mean square signal level by summing squared digital values of the audio data stream over a second time period. The treble shelf filter can perform a treble cut filter by inputting a third dB value output from a second lookup table based on inputting the second root mean square signal level to the second lookup table that determines the third dB value to output to the treble shelf filter for second root mean square signal values between zero and second percentage of a maximum audio volume, wherein the treble shelf filter performs a treble cut filter by inputting a fourth dB value output from the second lookup table based on inputting the second root mean square signal level to the second lookup table that determines a fourth dB value output to the treble shelf filter for second root mean square signal levels between the second percentage of a maximum audio volume and a third percentage of the maximum audio volume and wherein the treble shelf filter performs a treble cut filter by inputting a fifth dB value output from the second lookup table based on inputting the second root mean square signal level to the second lookup table that determines the fifth dB value output from the second lookup table for second mean square signal levels between the third percentage of the maximum audio volume and the maximum audio volume. An audio volume level can be a value between zero and 100% that is applied to the audio data stream to determine an output signal strength to be applied. The audio data stream can include left and right stereo audio data streams and wherein the bass shelf filter and the treble shelf filter is applied to the left and right stereo audio data streams. The audio data stream can include a plurality of surround sound audio data streams and wherein the bass shelf filter and the treble shelf filter is applied to left and right stereo audio data streams before up mixing to form the plurality of surround sound audio data streams. The audio data stream can be processed by a vehicle audio system. The vehicle audio system can include a program selector to select audio program material. The vehicle audio system can include one or more computing devices and one or more digital signal processors. The vehicle audio system can be included in a vehicle infotainment system.

FIG. 1 is a diagram of a traffic infrastructure system 100 that includes a vehicle 110 operable in autonomous ("autonomous" by itself in this disclosure means "fully autonomous"), semi-autonomous, and occupant piloted (also referred to as non-autonomous) mode. One or more vehicle 110 computing devices 115 can receive data regarding the operation of the vehicle 110 from sensors 116. The computing device 115 may operate the vehicle 110 in an autonomous mode, a semi-autonomous mode, or a non-autonomous mode.

The computing device 115 includes a processor and a memory such as are known. Further, the memory includes one or more forms of computer-readable media, and stores instructions executable by the processor for performing various operations, including as disclosed herein. For example, the computing device 115 may include programming to operate one or more of vehicle brakes, propulsion (e.g., control of acceleration in the vehicle 110 by controlling one or more of an internal combustion engine, electric motor, hybrid engine, etc.), steering, climate control, interior and/or exterior lights, etc., as well as to determine whether and when the computing device 115, as opposed to a human operator, is to control such operations.

Via the vehicle network, the computing device 115 may transmit messages to various devices in the vehicle and/or receive messages from the various devices, e.g., controllers, actuators, sensors, etc., including sensors 116. Alternatively, or additionally, in cases where the computing device 115 actually comprises multiple devices, the vehicle communication network may be used for communications between devices represented as the computing device 115 in this disclosure. Further, as mentioned below, various controllers or sensing elements such as sensors 116 may provide data to the computing device 115 via the vehicle communication network.

In addition, the computing device 115 may be configured for communicating through a vehicle-to-infrastructure (V-to-I) interface 111 with a remote server computer 120, e.g., a cloud server, via a network 130, which, as described below, includes hardware, firmware, and software that permits computing device 115 to communicate with a remote server computer 120 via a network 130 such as wireless Internet (WI-FI®) or cellular networks. V-to-I interface 111 may accordingly include processors, memory, transceivers, etc., configured to utilize various wired and/or wireless networking technologies, e.g., cellular, BLUETOOTH® and wired and/or wireless packet networks. Computing device 115 may be configured for communicating with other vehicles 110 through V-to-I interface 111 using vehicle-to-vehicle (V-to-V) networks, e.g., according to Dedicated Short Range Communications (DSRC) and/or the like, e.g., formed on an ad hoc basis among nearby vehicles 110 or formed through infrastructure-based networks. The computing device 115 also includes nonvolatile memory such as is known. Computing device 115 can log data by storing the data in nonvolatile memory for later retrieval and transmittal via the vehicle communication network and a vehicle to infrastructure (V-to-I) interface 111 to a server computer 120 or user mobile device 160.

Controllers, as that term is used herein, are computing devices that typically are programmed to monitor and/or control a specific vehicle subsystem. In addition to examples listed above, an example of a controller is an infotainment controller 112. Infotainment is a combination of the words "information" and "entertainment." Infotainment controller 112 can obtain and present data to and from a vehicle occupant. An infotainment controller 112 can communicate with a computing device 115 or a cloud-based server computer 120 to present data to an occupant of a vehicle including operational data such as vehicle speed and direction, safety data such as seatbelt or door closure status, and music or video data. An infotainment controller 112 can communicate with a computing device 115 or a cloud-based server computer 120 to obtain data to be presented to a vehicle occupant visually via displays including video screens or auditorily via synthesized voice or recorded music or sounds. An infotainment controller 112 can acquire data regarding the operation of a vehicle from an occupant via physical controls such as dials or switches. An infotainment controller 112 can also communicate with a computing device 115 or a cloud-based server computer 120 to obtain input data from a vehicle via voice recognition. An infotainment controller 112 can further communicate with a computing device 115 or a cloud-based server computer 120 and sensors 116 to process video data that includes a vehicle occupant to obtain input data via gesture recognition.

Figure 2:
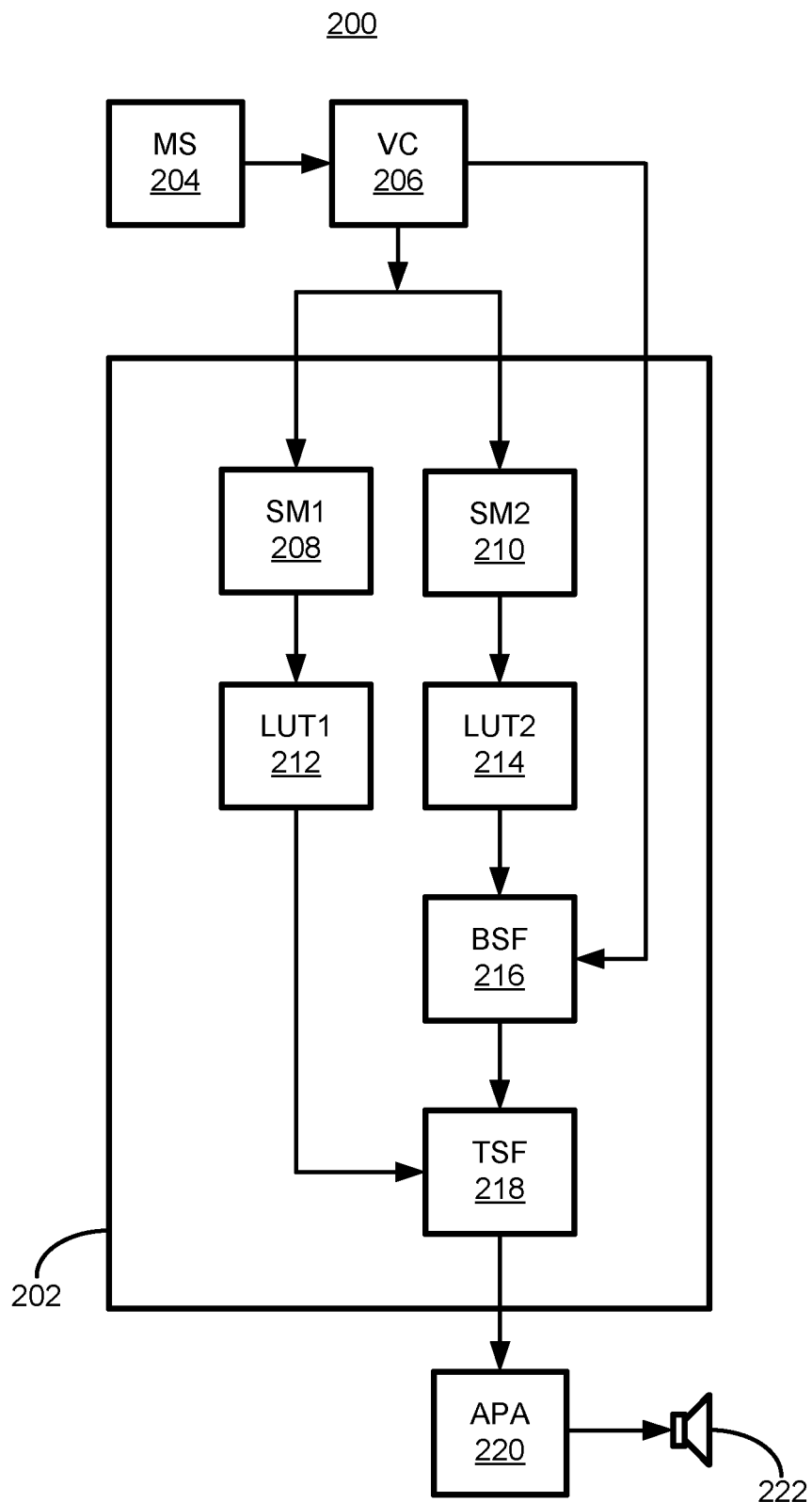
FIG. 2 is a diagram of an example vehicle audio system.

FIG. 2 is a diagram of a vehicle audio system 200. A vehicle audio system 200 is part of a vehicle entertainment system and is part of an infotainment controller 112. Portions of a vehicle audio system 200, such as portions of a mode selector 204 and a volume control 206 can be implemented as software executing on processors included in computing device 115. The audio data processor 202, for example, is typically implemented as software executing on a processor or digital signal processor (DSP) included in computing device 115. In some examples, mode selector 204, volume control 206 and audio data processor 202 can be implemented all or in part as analog circuitry that perform the same functions as the digital examples described herein.

Mode selector 204 selects an audio program which includes the audio data from an audio program source. The audio program source can be a radio tuner which receives signals transmitted via radio frequency. The audio program source can also be a physical device such as a compact disc or solid-state storage device. The audio program source can also be a BLUETOOTH signal, for example, from a smart phone or other handheld device. The audio program source can also be a digital signal stored in memory on computing device 115 or downloaded from a cloud-based server computer 120. The audio program source can also be an internet audio stream. The mode selector 204 chooses an audio program source based on user input and passes the selected audio data to a volume control 206. The volume control 206 increases or decreases the audible power output by the vehicle audio system 200. In examples where the audio data is an analog signal the volume control 206 operates by increasing or decreasing the voltage of the audio data. In examples where the audio data is a digital signal, the volume control increases or decreases the digital values included in the audio data. In this example, when the audio program source includes analog audio data, the analog audio data is converted to a digital signal using an analog-to-digital (A/D) converter at some point prior to passing the audio data to the audio data processor 202. This can occur before or after mode select 204 or volume control 206.

Audio data processor 202 operates by determining two separate volume levels for the audio data using two separate root-mean-square (RMS) signal level measurement blocks (SM1 and SM2) 208, 210. RMS signal level measurement is a technique for measuring the signal strength of complex waveforms such as audio data, which includes sinusoidal signals having positive and negative values. RMS signal level measurement divides the audio data into samples of approximately equal time duration. Each sample is processed by square integration, where the digital audio data in the sample is integrated by summing the squared values included in the sample. Squaring the values in the audio data permits the squared sum to correctly correspond to the amount of energy included in the sample. The squared samples are then averaged to produce a number that corresponds to the average energy over a time period corresponding to the total number of samples.

In this example the RMS signal level measurement block 208 has a time period of two seconds and the RMS signal level measurement block 210 has a time period of five seconds. The RMS signal levels can be determined with a moving window process. A moving window process outputs a new RMS signal level for each new sample input to the process. The oldest squared, summed sample is subtracted from the sum and the newest squared, summed is added prior to averaging. In this fashion a new RMS signal level is available at each time sample interval and reflects the last n time intervals, where n is the total number of samples to be averaged. The time interval can range from less than one millisecond to greater than 10 milliseconds. The RMS signal level measurement blocks 208, 210 measure the volume levels of the input audio data which is a combination of the volume level of the audio program source, the volume level at which the audio data was recorded, and the volume level set by the volume control 206.

Following RMS signal measurement blocks 208, 210, two separate copies of the measured RMS signal value are passed to lookup tables (LUT1 and LUT2) 212, 214. Lookup tables 212, 214 implement the functions illustrated in FIGS. 3 and 4, respectively. A lookup table 212, 214 is an indexed array of values which can be used to replace runtime computation of a function by a simpler array access. For example, values for a function of one variable y=f(x) can be calculated for a range of x values. The values of x can be indexed, meaning that they are assigned integer values between 1 and n, the number or x values. A table or array can be constructed that stores the calculated y value at the index equal to the corresponding x value. At runtime a value of x can be used to select an index that is used to access the corresponding value of y from the lookup table without requiring computation of the function y=f(x).

Lookup tables can also be used to determine values for functions expressed as graphs. For example, lookup tables 212, 214 are indexed arrays corresponding to the dB values specified in graphs 300 and 400, respectively. The index values for lookup tables 212, 214 are determined based on the RMS signal values occurring on the x-axis of graphs 300 and 400 respectively. A range and sample rate for the RMS signal values occurring on the x-axis of graphs 300 and 400 can be selected to convert RMS signal values to indices. For example, the x-axis on graph 300 has a range of 0%-100% and the x-axis on graph 300 has a range of 0%-40%. The RMS signal values can be sampled at a rate of 0.1%, for example, yielding indices of 0-1000 for graph 300 and indices of 0-400 for graph 400. The lookup table 212, 214 values occurring at the index values specified by the RMS signal values from graphs 300 and dB values from the y-axis of graphs 300 and 400, respectively.

Lookup tables 212, 214 operate by selecting an index based on a measured RMS signal value and using the lookup table 212, 214 to determine a dB value to apply to the audio data using treble shelf filter (TSF) 218 and bass shelf filter (BSF) 216, respectively. For example, in lookup table 212, index values of 0, 200, 400, and 1000, corresponding to RMS signal values of 0%, 20%, 40% and 100% yield dB values of −16 dB, 0 dB, 0 dB and −5 dB, respectively. In lookup table 214, index values of 0, 100, and 400, corresponding to RMS signal values of 0%, 10%, and 40% yield dB values of 6 dB, 6 dB, and 0 dB, respectively. Based on the measured RMS signal value output by RMS signal measurement blocks 208, 210, lookup tables 212, 214 output a digital value corresponding to a dB gain or dB cut to be passed to the bass and treble shelf filters. A positive dB value (>0) corresponds to a dB gain, meaning an increase in audio data stream level. A negative dB value (<0) corresponds to a dB cut, meaning a decrease in audio data stream level. A 0 dB value corresponds to no change in audio data stream level.

The dB cut or dB gain value output by lookup tables 212, 214 are input to treble shelf filter (TSF) 218 and bass shelf filter (BSF) 216, respectively. A shelf filter is a filter that operates on a range of frequency values. For example, treble shelf filter, also referred to as a treble cut filter, reduces all frequencies in the digital audio data from about 4000 Hz up to the maximum frequency of the vehicle audio system 200, typically about 20,000 Hz by the dB value specified by the dB cut output from lookup table 212. A bass shelf filter, also referred to as a bass boost filter, boosts or increases all bass frequencies in the digital audio data between the lowest frequency output from a vehicle audio system, typically about 20 Hz, and typically up to about 300 Hz, by the amount specified by the output from lookup-table 214. Audio data output from the volume control 206 is input to the bass shelf filter 216 where the signal is bass filtered according to the output from lookup table 214. The bass filtered audio data is then passed to the treble shelf filter 218 where the bass filtered audio data is treble filtered according to the output from lookup table 212.

The bass and treble filtered audio data stream is then typically converted to an analog signal using a digital-to-analog (D/A) converter and passed to an audio power amplifier (APA) 220 where the signal level is increased to levels appropriate to drive a speaker 222 to produce audio signals to be heard by listeners in a vehicle 110. Because RMS signal measurement block 208 has an integration time of two seconds, the treble shelf filter 218 will operate with a delay of about two seconds. Because RMS signal measurement block 210 has an integration time of five seconds, the bass shelf filter 216 will operate with a delay of about five seconds. These delays will permit the audio data processor 202 to respond to changes in audio program data without causing the audio data processor 202 to respond to transitory changes in audio data such as brief pauses in music or temporarily loud or soft portions. A two second delay on treble shelf filtering and a five second delay on bass shelf filtering permits the audio data processor to track changes in audio program data without sounding "jumpy", i.e., where too-frequent changes in treble or bass filters become objectionable.

In examples were stereo audio data is to be processed, signal level measurement blocks (SM1 and SM2) are fed with a mono signal comprising of the sum of left and right. Look up tables (LUT1, and LUT2) then feed stereo bass shelf and treble shelf filters. This is to ensure that stereo staging does not deviate as frequency content in the left and right source signal changes. The output of the stereo treble shelf filter is then sent to two separate audio power amplifiers 220 and speaker 222. In the case of a multichannel system the scheme described herein would be applied in stereo, before an up mixing stage that forms the multichannel signals from stereo signals. Audio power amplifier 220 can also power two or more speakers 222 with the same amplified audio data.

Techniques discussed herein improve upon existing systems for adjusting EQ by processing audio data following volume control 206 adjustment, thereby taking into account volume control adjustment, changes in audio program source volume and changes in the audio data itself. Techniques discussed herein apply a first delay on treble adjustment and a second delay on bass adjustment, thereby achieving EQ adjustments that sound pleasing to a human listener. The first delay is generally less than the second delay. The first delay can range from less than one second to greater than three seconds and can typically be about two seconds. The second delay can range from less than two seconds to greater than ten seconds and can typically be about five seconds. RMS signal measurements and lookup tables provide computationally efficient techniques for measuring audio data on an ongoing basis without requiring band-pass filters to measure and adjust bass, mid-range and treble portions of an audio data stream separately while providing equivalent results.

Figure 3:
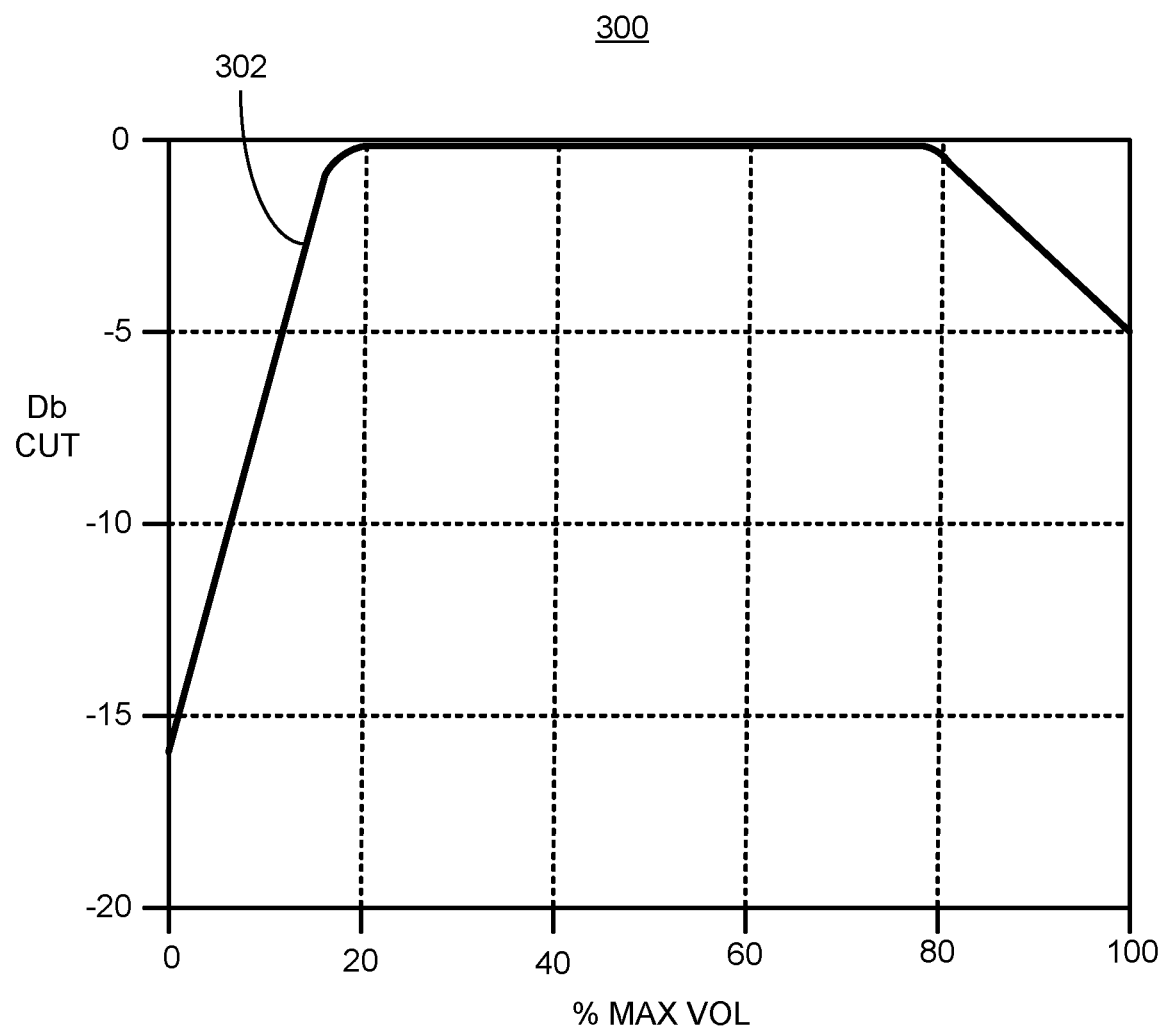
FIG. 3 is a diagram of an example treble shelf filter.

FIG. 3 is a graph 300 of an example treble shelf filter implemented in lookup table 212. Graph 300 plots the cut value of lookup table 212 in dB vs. percentage of maximum volume. Curve 302 starts at −16 dB signal cut at 0 volume and ramps up to 0 dB signal cut at about 20% of maximum volume. This tends to eliminate the "hiss" or "fizz" sound that is usually apparent to a listener at low volumes, where the treble portion of the signal is the only signal with enough power to be heard by a listener. At volumes over 80% of maximum system volume up to 100% of maximum system volume, curve 302 drops from 0 dB cut to 5 dB cut. This eliminates the harshness caused by over-amplifying high frequencies a high volume.

Figure 4:
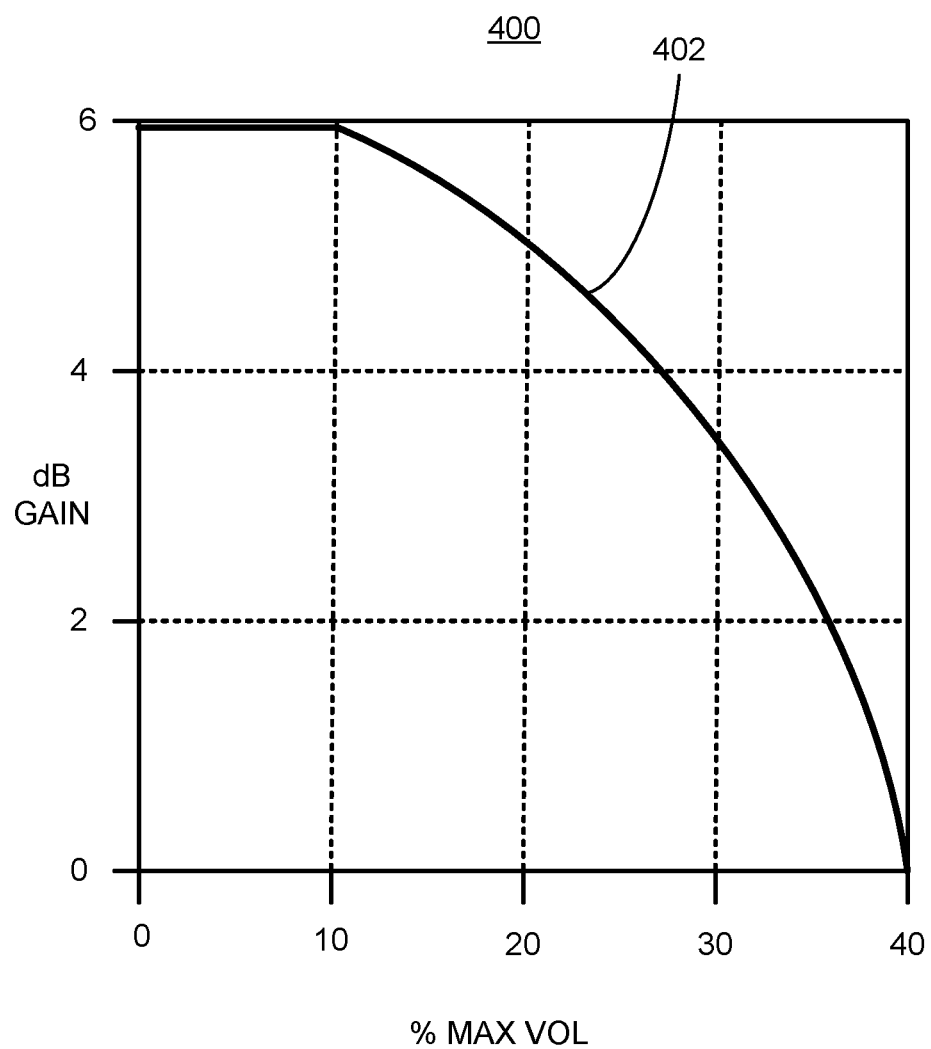
FIG. 4 is a diagram of an example bass shelf filter.

FIG. 4 is a graph 400 of an example bass shelf filter implemented in lookup table 214. Graph 400 plots the boost value of lookup table 214 in dB vs. percentage of maximum volume. This tends to compensate for the apparent lack of bass in low volume audio caused by low frequencies (bass) requiring more power than high frequencies (treble) to move air and produce listenable signals. Curve 402 starts at 0 volume and maintains 6 dB gain up to 1-% of maximum system volume. Curve 402 then reduces to 0 dB gain from 10% of maximum system volume to 40% of maximum system volume. Bass gain remains at 0 dB from 40% of maximum system volume to 100% of maximum system volume.

Figure 5:
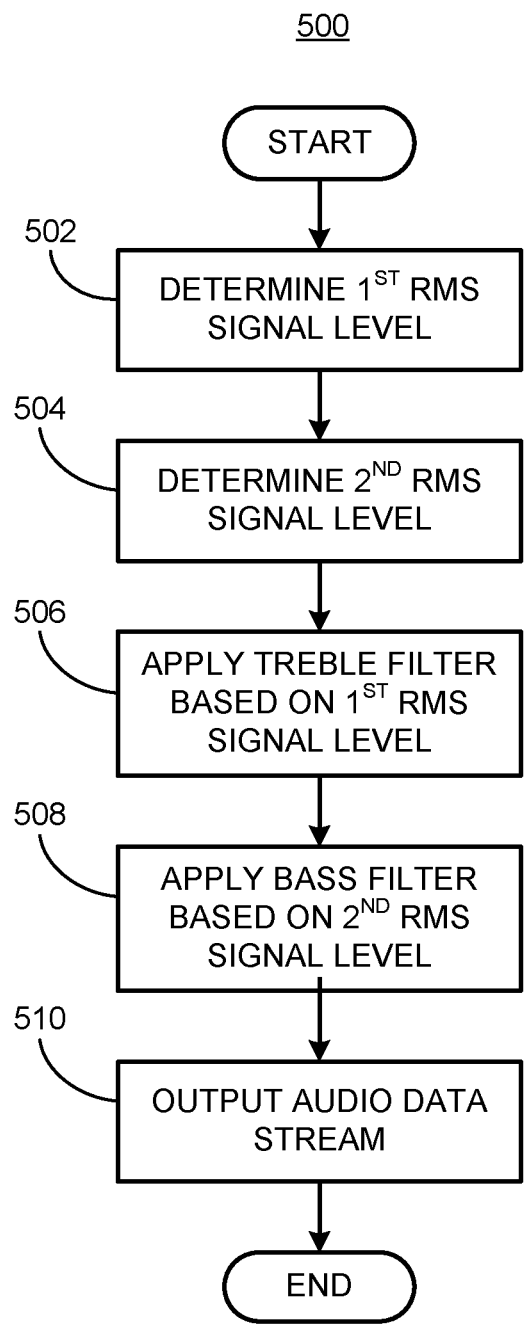
FIG. 5 is a flowchart diagram of an example process to control vehicle audio.

FIG. 5 is a flowchart diagram of a process 500 described in relation to FIGS. 1-4, of a process 500 for adjusting EQ on a vehicle audio system. Process 500 can be implemented by a processor of computing device 115, taking as input audio data from a plurality of audio sources, executing commands, and outputting audio data, for example. Process 500 includes multiple blocks that can be executed in the illustrated order. Process 500 could alternatively or additionally include fewer blocks or can include the blocks executed in different orders.

Process 500 begins at block 502, where a computing device 115 included in a vehicle 110 inputs audio data corresponding to an audio program selected by mode select 204 in response to input by a user or input from computing device 115. For example, a user can select a music program or radio station. The determined audio data is output by mode select 204 through volume control 206 to a first RMS signal level measurement block 208. First RMS signal level measurement block 208 measures the average squared sample value of audio data over two seconds. The first RMS signal level measurement is passed to first lookup table 212. First lookup table implements the treble dB cut curve 302 illustrated in FIG. 3.

At block 504 audio data is input to a second RMS signal level measurement block 210. Second RMS signal level measurement block 210 measures the average squared sample value of audio data over five seconds. The second RMS signal level measurement is passed to second lookup table 214. Second lookup table implements the bass boost curve 402 illustrated in FIG. 4.

At block 506 a bass shelf filter 216 implements the bass boost value output by second lookup table 214 on bass frequencies between 20 Hz and 300 Hz and outputs the bass boosted audio data to treble shelf filter 218.

At block 508 a treble shelf filter 218 implements the treble cut value output by first lookup table 212 on the audio data output by bass shelf filter 216 and outputs the bass boosted and treble cut audio data to audio power amplifier 220.

At block 510 the output bass-boosted and treble-cut audio data is amplified to signal levels appropriate to drive one or more speakers 222 and output to the one or more speakers 222 to produce audible audio signals. Following block 510 process 500 ends.

Computing devices such as those discussed herein generally each includes commands executable by one or more computing devices such as those identified above, and for carrying out blocks or steps of processes described above. For example, process blocks discussed above may be embodied as computer-executable commands.

Computer-executable commands may be compiled or interpreted from computer programs created using a variety of programming languages and/or technologies, including, without limitation, and either alone or in combination, Java™, C, C++, Python, Julia, SCALA, Visual Basic, Java Script, Perl, HTML, etc. In general, a processor (e.g., a microprocessor) receives commands, e.g., from a memory, a computer-readable medium, etc., and executes these commands, thereby performing one or more processes, including one or more of the processes described herein. Such commands and other data may be stored in files and transmitted using a variety of computer-readable media. A file in a computing device is generally a collection of data stored on a computer readable medium, such as a storage medium, a random access memory, etc.

A computer-readable medium includes any medium that participates in providing data (e.g., commands), which may be read by a computer. Such a medium may take many forms, including, but not limited to, non-volatile media, volatile media, etc. Non-volatile media include, for example, optical or magnetic disks and other persistent memory. Volatile media include dynamic random access memory (DRAM), which typically constitutes a main memory. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, an EPROM, a FLASH-EEPROM, any other memory chip or cartridge, or any other medium from which a computer can read.

All terms used in the claims are intended to be given their plain and ordinary meanings as understood by those skilled in the art unless an explicit indication to the contrary in made herein. In particular, use of the singular articles such as "a," "the," "said," etc. should be read to recite one or more of the indicated elements unless a claim recites an explicit limitation to the contrary.

The term "exemplary" is used herein in the sense of signifying an example, e.g., a reference to an "exemplary widget" should be read as simply referring to an example of a widget.

The adverb "approximately" modifying a value or result means that a shape, structure, measurement, value, determination, calculation, etc. may deviate from an exactly described geometry, distance, measurement, value, determination, calculation, etc., because of imperfections in materials, machining, manufacturing, sensor measurements, computations, processing time, communications time, etc.

In the drawings, the same reference numbers indicate the same elements. Further, some or all of these elements could be changed. With regard to the media, processes, systems, methods, etc. described herein, it should be understood that, although the steps or blocks of such processes, etc. have been described as occurring according to a certain ordered sequence, such processes could be practiced with the described steps performed in an order other than the order described herein. It further should be understood that certain steps could be performed simultaneously, that other steps could be added, or that certain steps described herein could be omitted. In other words, the descriptions of processes herein are provided for the purpose of illustrating certain embodiments, and should in no way be construed so as to limit the claimed invention.

The invention claimed is:

1. A computer, comprising:
  a processor; and
    a memory, the memory including instructions executable by the processor to:
      determine a first root mean square signal level for an audio data stream with a first delay by summing squared digital values of the audio data stream over a first time period and apply a bass shelf filter to the audio data stream based on the first root-mean-square signal level;
      determine a second root-mean-square signal level for the audio data stream with a second delay by summing squared digital values of the audio data stream over a second time period and apply a treble shelf filter to the audio data stream based on the second root-mean-square signal level; and
    output the audio data stream to an audio power amplifier.

2. The computer of claim 1, the instructions including further instructions to determine the audio data stream by sampling and digitizing an analog audio signal.

3. The computer of claim 1, wherein the first delay is greater than the second delay.

4. The computer of claim 1, the instructions including further instructions to determine the first root mean square signal level by summing squared digital values of the audio data stream over a first time period.

5. The computer of claim 1, wherein the bass shelf filter performs a bass boost filter by inputting a first dB value output by a first lookup table based on inputting the first root mean square signal level to the first lookup table to determine the first dB value to output to the bass shelf filter for first root mean square signal values between zero and a first percentage of a maximum audio volume and wherein the bass shelf filter performs a bass boost filter by inputting a second dB value output by the first lookup table based on inputting the root mean square signal level to the first lookup table to determine a second dB value to output to the bass shelf filter for first root mean square signal values between the first percentage and a maximum audio volume.

6. The computer of claim 1, the instructions including further instructions to determine the second root mean square signal level by summing squared digital values of the audio data stream over a second time period.

7. The computer of claim 1, wherein the treble shelf filter performs a treble cut filter by inputting a third dB value output from a second lookup table based on inputting the second root mean square signal level to the second lookup table that determines the third dB value to output to the treble shelf filter for second root mean square signal values between zero and second percentage of a maximum audio volume, wherein the treble shelf filter performs a treble cut filter by inputting a fourth dB value output from the second lookup table based on inputting the second root mean square signal level to the second lookup table that determines a fourth dB value output to the treble shelf filter for second root mean square signal levels between the second percentage of a maximum audio volume and a third percentage of the maximum audio volume and wherein the treble shelf filter performs a treble cut filter by inputting a fifth dB value output from the second lookup table based on inputting the second root mean square signal level to the second lookup table that determines the fifth dB value output from the second lookup table for second mean square signal levels between the third percentage of the maximum audio volume and the maximum audio volume.

8. The computer of claim 1, wherein an audio volume level is a value between zero and 100% that is applied to the audio data stream to determine an output signal strength to be applied to one or more speakers.

9. The computer of claim 1, wherein the audio data stream includes left and right stereo audio data streams and wherein the bass shelf filter and the treble shelf filter is applied to the left and right stereo audio data streams.

10. The computer of claim 1, wherein the first time period is greater than the second time period.

11. A method, comprising:
  determining a first root-mean-square signal level for an audio data stream with a first delay by summing squared digital values of the audio data stream over a first time period and apply a bass shelf filter to the audio data stream based on the first root-mean-square signal level;
  determining a second root-mean-square signal level for the audio data stream with a second delay by summing squared digital values of the audio data stream over a second time period and apply a treble shelf filter to the audio data stream based on the second root-mean-square signal level; and
  outputting the audio data stream to an audio power amplifier.

12. The method of claim 11, further comprising determining the audio data stream by sampling and digitizing an analog audio signal.

13. The method of claim 11, wherein the first delay is greater than the second delay.

14. The method of claim 11, further comprising determining the first root mean square signal level by summing squared digital values of the audio data stream over a first time period.

15. The method of claim 11, wherein the bass shelf filter performs a bass boost filter by inputting a first dB value output by a first lookup table based on inputting the first root mean square signal level to the first lookup table to determine the first dB value to output to the bass shelf filter for first root mean square signal values between zero and a first percentage of a maximum audio volume and wherein the bass shelf filter performs a bass boost filter by inputting a second dB value output by the first lookup table based on inputting the root mean square signal level to the first lookup table to determine a second dB value to output to the bass shelf filter for first root mean square signal values between the first percentage and a maximum audio volume.

16. The method of claim 11, further comprising determining the second root mean square signal level by summing squared digital values of the audio data stream over a second time period.

17. The method of claim 11, wherein the treble shelf filter performs a treble cut filter by inputting a third dB value output from a second lookup table based on inputting the second root mean square signal level to the second lookup table that determines the third dB value to output to the treble shelf filter for second root mean square signal values between zero and second percentage of a maximum audio volume, wherein the treble shelf filter performs a treble cut filter by inputting a fourth dB value output from the second lookup table based on inputting the second root mean square signal level to the second lookup table that determines a fourth dB value output to the treble shelf filter for second root mean square signal levels between the second percentage of a maximum audio volume and a third percentage of the maximum audio volume and wherein the treble shelf filter performs a treble cut filter by inputting a fifth dB value output from the second lookup table based on inputting the second root mean square signal level to the second lookup table that determines the fifth dB value output from the second lookup table for second mean square signal levels between the third percentage of the maximum audio volume and the maximum audio volume.

18. The method of claim 11, wherein an audio volume level is a value between zero and 100% that is applied to the audio data stream to determine an output signal strength to be applied.

19. The method of claim 11, wherein the audio data stream includes left and right stereo audio data streams and wherein the bass shelf filter and the treble shelf filter is applied to the left and right stereo audio data streams.

20. The method of claim 11, wherein the first time period is greater than the second time period.

* * * * *